April 2, 1957 W. A. BOOTHE 2,787,253

FLUID PRESSURE AMPLIFIER

Filed Aug. 24, 1955 2 Sheets-Sheet 1

Inventor:
Willis A. Boothe,
by Merton D. Morse
His Attorney.

April 2, 1957 W. A. BOOTHE 2,787,253

FLUID PRESSURE AMPLIFIER

Filed Aug. 24, 1955 2 Sheets-Sheet 2

Inventor:
Willis A. Boothe,
by Merton D. Moore
His Attorney.

United States Patent Office 2,787,253

Patented Apr. 2, 1957

2,787,253

FLUID PRESSURE AMPLIFIER

Willis A. Boothe, Schenectady, N. Y., assignor to General Electric Company, a corporation of New York Application August 24, 1955, Serial No. 530,363

12 Claims. (Cl. 121—41)

This invention relates to fluid pressure amplifiers of the type which may be utilized to amplify both force and motion. More particularly, this invention relates to a fluid pressure means of accomplishing mechanical multiplication which may be used selectively and collectively to perform motion and force amplification, and multiplication of a pair of input signals.

In most mechanical control systems, the motion and power level from the control sensor or sensors must be multiplied before operating additional members of the control system. Specific amplifiers have been designed for use with individual applications, but a single stage variable gain fluid pressure amplifier capable of operation from a low level input signal is not available. A single stage variable gain fluid pressure amplifier would be capable of being applied in a wide range of applications in the field of hydraulic and pneumatic control and would eliminate the necessity of designing a specific amplifier for each application. Such a fluid pressure amplifier may also be used as a computer element to multiply an input signal and a gain varying signal.

Accordingly, it is an object of this invention to provide fluid pressure means for accomplishing mechanical multiplication of an input signal.

Another object of this invention is to provide fluid pressure means of multiplying the motion and power level of an input signal.

Still another object of this invention is to provide a fluid pressure amplifier having a variable gain for multiplying the motion and power level of an input signal.

A further object of this invention is to provide a fluid pressure amplifier for amplifying the motion and power level of an input signal and providing means for varying the gain of the amplifier to obtain an output motion proportional to the product of the input signal and a gain varying signal.

The novel features which are believed to be characteristic of this invention are set forth with particularity in the appended claims. The invention, however, both as to its organization and method of operation, together with further objects and advantages thereof, may best be understood by reference to the following description taken in connection with the accompanying drawings, in which:

Figure 1:
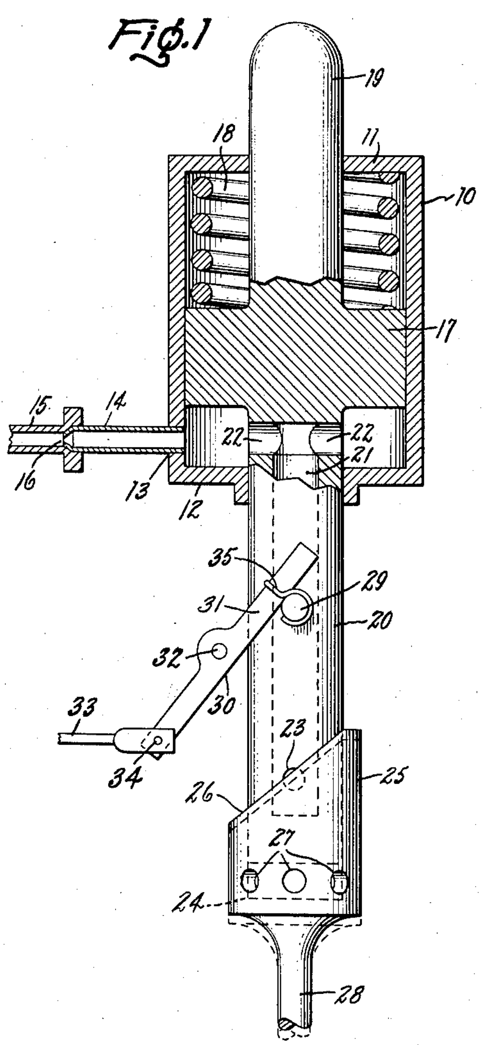
Fig. 1 represents a side elevational view in partial section of one embodiment of this invention showing the device in an equilibrium position in dash lines and immediately after the input shaft has been actuated in solid lines.
Figure 2:
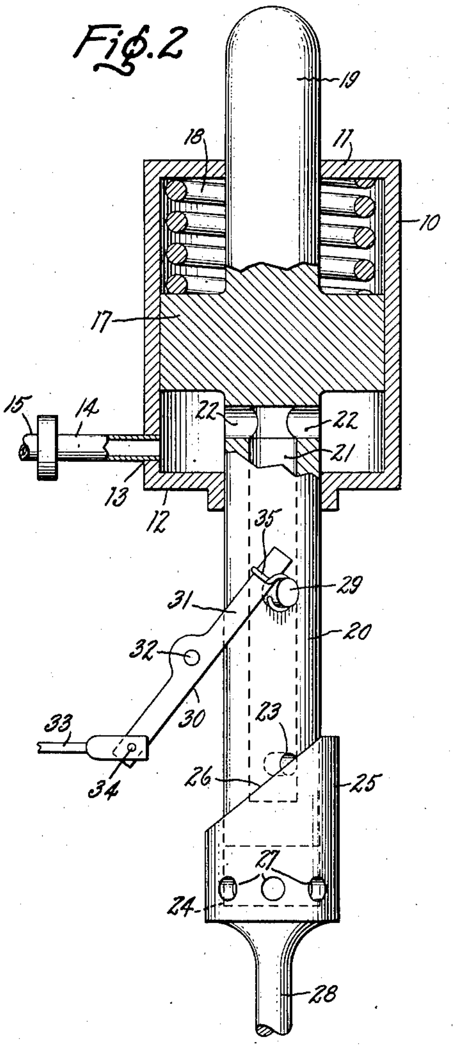
Fig. 2 is a view similar to that of Fig. 1 and shows the same embodiment of the invention after the amplifier has again reached a position of equilibrium.
Figure 3:
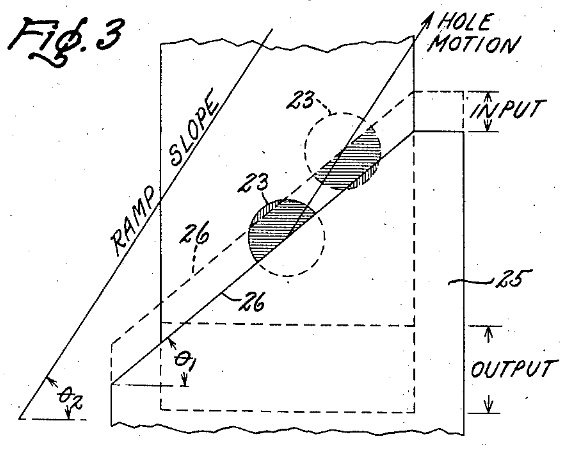
Figure 4:
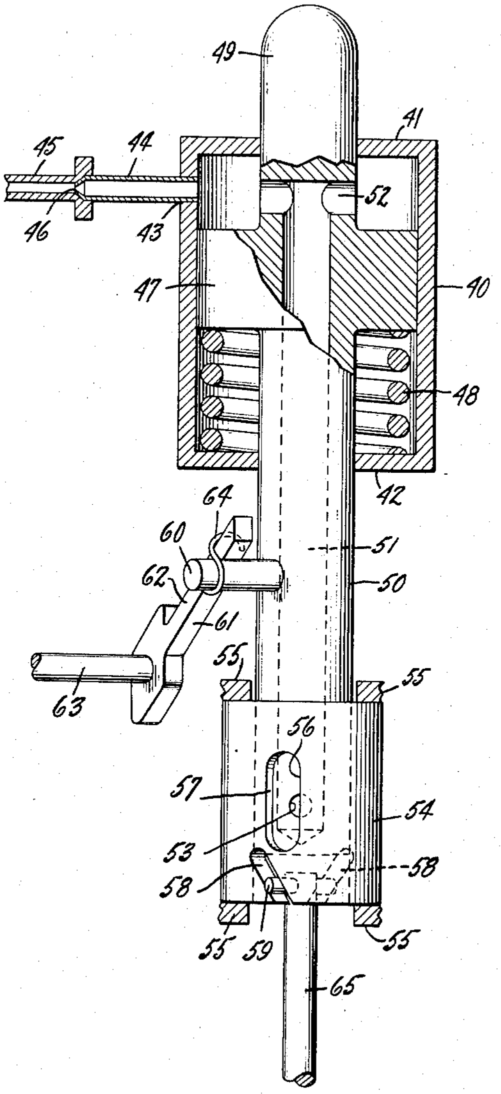
Figure 5:
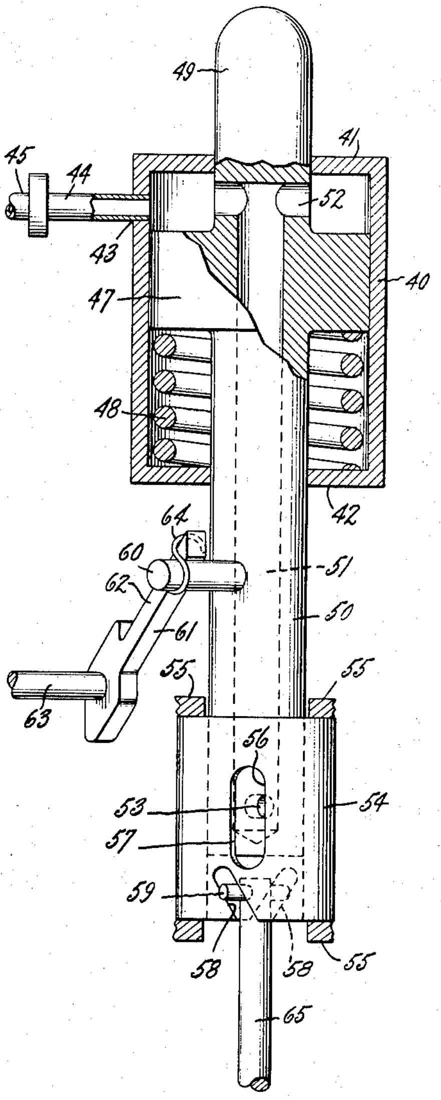

Fig. 3 is a diagrammatic detail view showing certain operational characteristics of the amplifier illustrated in Figs. 1 and 2; and Figs. 4 and 5 are side elevational views in partial section of another embodiment of this invention showing the amplifier in an initial equilibrium and in a position after the application of an input signal where the system has again reached an equilibrium position, respectively.

The amplifier of this invention utilizes a fluid pressure actuated power amplifier which is illustrated as a cylinder having a fluid pressure inlet port and a piston therein biased against movement by fluid pressure at the inlet port in any manner, such as by a spring between the piston and a cylinder end wall. The piston is provided with an output motion transmitting shaft which extends out through one cylinder end wall and a hollow motion input shaft extending through the opposite cylinder end wall. As illustrated, the output motion transmitting shaft, the piston, and the motion input shaft form a rigid motion transmitting structure. The hollow motion input shaft is provided with an external port outside the cylinder and the rigid motion transmitting structure is provided with an internal port inside the cylinder to transmit pressurized fluid from the inlet port. A cup member is provided around the end of the input shaft which is outside the cylinder. The cup member has a port closing edge to control the area of the external port of the input shaft in response to a control sensor and thereby determine the fluid pressure in the cylinder and the equilibrium position of the piston in the cylinder.

In order to provide motion amplification, a cam follower (illustrated in the form of a pin) is fixed to the motion input shaft and mated with a cam surface on a feedback ramp. The feedback ramp is positioned at an angle relative to the longitudinal axis of motion input shaft and thereby causes the shaft and piston to have a rotary motion in addition to the motion which is longitudinal of the motion input shaft. Thus, the external port is guided past the port closing edge of the cup. The slope and contour of the cam surface on the feedback ramp determines the degree and character of motion amplification provided by the device. As desired, the cam surface may be fixed to determine the system gain or may be arranged to have its slope varied by a separate control sensor to vary the amplifier gain. In the latter case, the output of the amplifier will be a function of the product of the input signal and the gain varying signal.

Referring specifically to Figs. 1 and 2, an enclosed cylinder 10 is provided with an upper end wall 11, a lower end wall 12, and a fluid pressure inlet port 13 for supplying a fluid under pressure to the cylinder. Fluid pressure conduits 14 and 15 are provided to connect the fluid pressure inlet port 13 to a fluid source which is not shown. In order to inject the fluid into the cylinder 10 at the proper pressure, an orifice 16 is utilized in the supply conduits 14 and 15.

A piston 17 is positioned inside the cylinder 10 and biased by means of a spiral spring 18 against movement therein by fluid pressure. The spiral spring 18 is positioned between the upper end wall 11 of the cylinder 10 of the piston 17. In order to impart the motion of the piston 17 to a controlled element, an output motion transmitting shaft 19 is secured to the piston 17 and made to extend out through the upper cylinder end wall 11.

A hollow motion input shaft 20 is also fixed to the piston 17 and extends out through the lower cylinder end wall 12. Thus, the hollow motion input shaft 20, the piston 17, and the output motion shaft 19 form a unitary motion transmitting structure in this embodiment of the invention. In order to transmit the pressurized fluid from the inlet port 13 through cavity 21 in the hollow input motion shaft 20, an internal port 22 is provided inside the cylinder 10 and an external port 23 is provided outside the cylinder 10. Both the internal and external ports 22 and 23 are open to the cavity 21 in the hollow motion input shaft 20.

As illustrated, the lower end of the motion input shaft 20 fits in a recess 24 of a cup member 25. The cup member 25 is fixed against rotary motion by means not shown and is provided with a port closing edge 26 at its upper edge cut at an angle with respect to the longitudinal axis of the motion input shaft. In order to prevent the fluid utilized in the system from being trapped in the cavity 24 and impeding movement between the cup member 25 and the motion input shaft 20, ports 27, open to the internal cavity, are also provided in the cup member 25. The input signal is delivered to the amplifier by means of shaft 28 fixed to the bottom of the cup member. The actuating shaft 28 is intended to be connected to a control sensor and thereby impart a motion to cup member 25, which motion will necessarily be in the direction of the longitudinal axis of the motion input shaft 20.

Motion amplification is provided by a cam follower pin 29 fixed to the motion input shaft 20 and a feedback ramp 31. The cam follower pin 29 is mated with a cam surface 30 on the feedback ramp 31. The feedback ramp 31 is illustrated as being a simple bar pivoted near its center about a pivot pin 32 to provide means for adjusting or varying its slope. The cam surface 30 on feedback ramp 31 is illustrated as being a perfectly flat surface. The cam follower pin 29 and cam surface 30 on the feedback ramp 31 are maintained in contact with each other by a simple tying spring member 35. If motion amplification is to be had, the feedback ramp 31 must necessarily be positioned at an angle with respect to the longitudinal axis of the motion input shaft 20. An actuating rod 33 is pivotally fixed to the lower end of the feedback ramp by means of a connecting pin 34 and may be used to adjust the slope of the feedback ramp and to hold the feedback ramp in the position set. As will be explained subsequently, the actuating rod 33 may also be connected to receive an input signal to vary the gain of the amplifier while in use in order to multiply two input signals.

As illustrated by the broken lines in Fig. 1, the cup member 25 is in an initial equilibrium position relative to the external port 23 in the motion input shaft 20. This position is, of course, determined by the balance between the piston biasing spring 18 and the fluid pressure applied at the inlet port 13. The cup 25, as drawn in full lines, represents the cup immediately after an input signal has been applied in the upward direction to the actuating shaft 28.

If the system were in its balanced or equilibrium condition when the cup member 25 is in its dash line position, moving the cup member 25 to its solid line position will cause an increase in pressure on the underside of the piston 17 and will consequently cause the piston to rise. Thus, the output motion transmitting shaft 19 will rise. If the feedback ramp 31 were not utilized and the rigid portion of the system (i. e., the piston 17, the output motion transmitting shaft 19, and the motion input shaft 20) were made to rise straight up, the rigid portion of the system would rise until an area of the external port 23 was open which exactly matched the area which was originally open. That is to say, that the system will again be balanced when the external port 23 will vent an amount of fluid which will cause the fluid pressure inside the cylinder 10 to balance the pressure of the biasing spring 18. Under such circumstances, it will be obvious that the movement of the input motion transmitting shaft 19 will be equal to the vertical motion of the cup member 25. Thus, power amplification may be obtained without the use of the feedback ramp 31, but motion amplification is not obtained until such a ramp is used.

Fig. 2 illustrates the fluid pressure amplifier of Fig. 1 after cup member 25 has been moved upwardly from its original equilibrium position of Fig. 1 and the system has once again reached the position of equilibrium. Components and elements of Fig. 2 which are the same as the components and elements of Fig. 1 are given corresponding numbers.

In order more clearly to understand the motion amplification provided, reference should be had to Fig. 3 of the drawing. In this figure, the cup member 25 and the external port 23, shown in solid lines, represent the position of these elements when the system is in equilibrium. For simplicity, this condition is shown as being the condition where the external port 23 is exactly half covered by the port closing edge 26 of the cup member 25. For this condition, all of the shaded area of the external port 23 above the solid port closing edge 26 is free and clear to vent fluid from the inlet port 13. When the cup member 25 is moved upwardly by the amount designated "input" on the drawing to the position shown in dash lines, all of the shaded area of the external port 23 is covered except for the shaded portion above the dash port closing edge 26. Thus, the pressure will build up beneath the piston 17 in the cylinder 10 and force the rigid part of the system to rise. Since the cam follower pin 29 on the input shaft 20 abuts the cam surface 30 of the feedback ramp 31, the motion input shaft 20 can not rise straight up but must rotate. Thus, the external port 23 does not raise straight up to clear the port closing edge 26 but rotates clockwise (all directions of rotation are described looking upwardly from the bottom of the motion input shaft 20) past the port closing edge 26.

The distance which the port 23 must rise in order to open or clear as much of the external port 23 as is necessary to place the system in equilibrium depends both upon the angle $\theta_1$ that the input closing edge 26 makes with a horizontal (assuming that the amplifier is placed with the longitudinal axis of the motion input shaft 20 vertical) and upon the angle $\theta_2$ which the feedback ramp 31 makes with a horizontal. For the condition shown in Figure 3, the ramp slope is indicated by the line so labelled and the direction of movement of the external port 23 is designated by the line labelled "hole motion." The initial movement of the cup member 25 is labelled "input" and the movement of the motion input shaft 20 is labelled "output." By a comparison of the input signal imparted and the output motion shown, it will readily be seen that the system is a motion amplifier as well as a power amplifier.

With the configuration of the port closing edge 26 of the cup member 25, as illustrated in Figs. 1, 2, and 3, the angle $\theta_2$ of the ramp 31 must be equal to, or greater than, the angle $\theta_1$ of the port closing edge 26 and less than 90 degrees if motion amplification is to take place. As previously described, when the ramp is made parallel to the longitudinal axis of the motion input shaft 20 (i. e., 90 degrees with respect to a horizontal), the output motion of the output motion transmitting shaft 19 will be equal to the input motion of the actuating shaft 28. If the angle $\theta_2$ of the ramp is set at a value greater than 90 degrees but less than 180 degrees, the system will act as a motion reducer rather than as a motion amplifier since for these conditions the external port 23 will be made to rotate away from the port closing edge 26 of the cup member 25. If the angle $\theta_2$ of the ramp 31 is just equal to the angle $\theta_1$ of the port closing edge 26, theoretically the gain of the system will be infinite. Actually, the external port 23 can only rise to the top edge of the cup member 25 or until the biasing spring 18 is fully compressed. If the ramp slope angle $\theta_2$ is made less than the angle of the port closing edge 26 $\theta_1$, the system will not operate.

The cam surface 30 on the feedback ramp 31 is shown as being straight. If, however, the contour of this cam surface is properly shaped, the output motion of the output motion transmitting shaft 19 can be made proportional to any desired function of the input signal; for example, by properly shaping the cam surface 30 of the feedback ramp 31, the output motion of the output motion transmitting shaft 19 may be made proportional to the square root of the input signal. Also, if a second input signal (herein referred to as a gain varying signal)

is applied to the actuator rod 33, it may be made to vary the slope of the feedback ramp 31 while the system is in operation. Thus, the output motion transmitting shaft 19 will have a motion which will be proportional to some gain constant multiplied by the product of the input signal and gain varying signal.

The system will also operate in reverse. For example, if the actuator shaft 28 is lowered from the system equilibrium position, the external port 23 will be opened to vent more fluid from the cylinder 10 and thereby reduce the pressure under the piston 17. The biasing spring will then force the piston 17 downwardly and the tying spring 35 will force the cam pin 29 to follow the cam surface 30 of the feedback ramp 31, thereby rotating the input motion shaft counterclockwise. An inspection of Fig. 3 shows that motion amplification is again obtained. In the above description the cup member 25 was said to be held or fixed against rotary motion in order to prevent the fluid pressure of the system from rotating it. However, it is evident that a rotary motion of the shaft 28 by external means will cause the port closing edge 26 of the cup member 25 to either open or close the port 23 in the hollow input motion shaft 20. Therefore, it is clear that a rotary motion of cup member 25 may be utilized to cause the output motion shaft 19 to move upwardly or downwardly along its longitudinal axis in the manner described above.

Another embodiment of the invention is illustrated in Figs. 4 and 5 of the drawings. Once again, the power amplification is provided by means of an enclosed cylinder 40 having upper and lower end walls 41 and 42, respectively, and an inlet port 43. The inlet port 43 is adapted to be connected to a source of fluid pressure by means of fluid flow conduits 44 and 45. An orifice 46 is provided in the fluid flow conduits to insure the proper pressure of the fluid injected into the cylinder 40. Again, a rigid structure is provided which includes a piston 47 positioned in the cylinder 40 and biased by a coil spring 48 against movement by fluid pressure at the inlet port 43, an output motion transmitting shaft 49 extending out through the upper cylinder end wall 41 and adapted to transmit the amplified motion to a controlled element, and a hollow input shaft 50 extending out through the lower end wall 42 of the cylinder 40. As in the amplifier of Figs. 1 and 2, the cavity 51 in the hollow input shaft 50 is adapted to pass fluid under pressure from the inlet port 43 by providing an internal port 52 inside the cylinder 40 which is open to the cavity 51 and the inlet port 43 and an external port 53 outside the cylinder 40.

The system described thus far differs from the embodiment of the invention illustrated in Figs. 1 and 2 in that the inlet port 43 is above the piston 47 and, as a consequence, the piston biasing spring 48 must be placed between the lower end wall 42 of the cylinder and the lower surface of the cylinder 47. This also makes it necessary to provide the internal port 52 immediately above the piston 47 and extend the internal cavity 51 of the motion input shaft through the piston.

The motion amplifying portion of the embodiment of the invention illustrated in Figs. 4 and 5 also differs from the embodiment of Figs. 1 and 2. The cup member 54 which surrounds the lower extremity of the motion input shaft 50 is provided with a port closing edge 56 and a pair of cam slots 58. The cup member is held against movement in a direction along the longitudinal axis of the motion input shaft 50 by stops 55 which are only diagrammatically shown. The port closing edge 56 of the cup member 54 is formed by one edge of an elongated aperture 57 which extends longitudinally of the cup member. In this case, the port closing edge 56 is made parallel to the longitudinal axis of the motion input shaft 50. The cam slots 58 of cup member 54 are diagonally opposite each other on the lower portion of the cup member and slope in opposite directions but at equal angles with respect to the longitudinal axis of the motion input shaft 50.

An actuator shaft 65 is provided to receive an input signal and be moved longitudinally of its axis thereby. A cam pin 59 is extended through the upper end of the actuating shaft 65 and is made long enough to mate with both cam slots 58 on the lower portion of the cup member 54. Thus, if the actuator shaft 65 is raised, the cup member 54 will be rotated clockwise about the motion input shaft 50 to open or partially open the external port 53. If the position shown in Fig. 4 represents a system equilibrium position and the cup member 54 is rotated to partially open the external port 53, pressure above the piston 47 is reduced and the biasing spring 48 will force the rigid structure upwardly.

If there were no feedback ramp involved, the system gain would theoretically be infinite and the piston would continue to travel upwardly. However, in the embodiment shown, it will be obvious that the piston motion would be stopped either by closure of the external port passing into the upper closed end of the elongated aperture 57 of the cup member 54 or by the inlet port 52 passing out of the cylinder 40. In practice, a stop may be provided to prevent the inlet port 52 from leaving the cylinder. In order to provide for a controlled motion amplification, a cam follower pin 60 is fixed to the motion input shaft 50 and mated with a cam surface 61 of a feedback ramp 62. The feedback ramp 62 is supported at the end of an actuator rod 63 which may be rotated to adjust the angle of slope of the feedback ramp 62. Once again, the cam follower pin 60 is secured to the feedback ramp 62 by means of a tying spring member 64.

With this arrangement, opening the inlet port 53 (opening the port from the system equilibrium position, as illustrated in Fig. 4) will cause the piston 47 to move upwardly, and the feedback ramp 62 and cam follower pin 60 will force the rigid structure of the system to rotate clockwise to thereby move the external port 53 past the port closing edge 56 of the cup member 54. This movement will take place until the external port 53 is closed to the same extent that it originally was, thereby returning the system to equilibrium. This condition is illustrated in Fig. 5. The system will also operate to amplify a signal which moves the actuator shaft 65 downwardly. For example, if the actuator shaft is moved downwardly, it will force the cup member 54 to rotate counterclockwise and the port closing edge of the elongated aperture 57 to obstruct the external port 53. Consequently, pressure will build up in the cylinder 40 above the piston 47 and force the rigid structure downwardly. The tying spring 64 causes the cam follower pin 60 to follow the slope of the feedback ramp 62, thereby rotating the rigid motion transmitting structure counterclockwise. This rotation moves the external port 53 past the port closing edge of the elongated aperture 57 in a direction to free the port 53. This action continues until a point of equilibrium is again obtained.

The gain of the system illustrated in Figs. 4 and 5 is represented by the tangent of the angle of the cam slots 58 with respect to the longitudinal axis of the motion input shaft 50 divided by the tangent of the angle of the feedback ramp 62 with respect to the longitudinal axis of the motion input shaft 50. Once again, it will be seen that the system will act as a simple motion and power amplifier if the feedback ramp 62 is held stationary and may be used as a computer to obtain the product of two signals if a second signal is used to vary the angle of the feedback ramp at the same time a signal is being applied to the actuator shaft 65. Under such circumstances, motion of the output motion shaft 49 is proportional to a gain constant multiplied by the product of the input signal applied to an actuator shaft 65 and the gain varying signal applied to rotate the actuator bar 63.

From the embodiments of the invention illustrated and the above description, it will readily be seen that the placement of the fluid pressure port relative to the cylinder is unimportant, and that the systems may be changed to accommodate either a power amplifying element where an increased pressure in the cylinder will raise the piston, as illustrated in Figs. 1 or 2, or where an increased pressure in the cylinder will lower the piston, as illustrated in Figs. 4 and 5. It should also be understood that the use of the spiral spring as a piston biasing and moving element in the amplifier is an expedient which might be replaced by other means; for example, with slight system variation, a double acting piston might be used (double acting as distinguished from the single acting piston arrangement illustrated).

While particular embodiments of this invention have been shown, it will be understood that the invention is not limited thereto since many modifications in both the physical arrangement and in the instrumentalities employed may be made. It is contemplated that the appended claims will cover any such modifications as fall within the true spirit and scope of this invention.

What I claim as new and desire to secure by Letters Patent of the United States is:

1. A fluid pressure power and motion amplifier comprising fluid pressure power amplification means having an output motion transmitting shaft and a hollow motion input shaft operably connected thereto, said hollow motion input shaft having an external port open to the passage in said input shaft and venting the fluid from said power amplification means, a cup member having a port closing edge positioned around said motion input shaft in such a manner as to obstruct fluid flow through said external port and thereby determine the open area of said external port, a cam follower fixed to said motion transmitting structure, and a feedback ramp having a cam surface thereon, said cam follower and said cam surface being mated to impart a rotary motion to said motion input shaft upon movement of said motion input shaft along its longitudinal axis.

2. A fluid pressure amplifier as set forth in claim 1 wherein the angle of said feedback ramp is adjustable relative to the longitudinal axis of said motion input shaft.

3. A fluid pressure amplifier having an enclosed cylinder with a fluid pressure inlet port, a piston disposed in said cylinder for operation by fluid pressure at said inlet port and biased against movement thereby, an output motion transmitting shaft and a hollow motion input shaft extending through opposite end walls of said cylinder and operably connected to said piston to form a motion transmitting structure therewith, said hollow motion input shaft having an external port outside said cylinder and said motion transmitting structure having an internal port inside said cylinder, said internal and external ports communicating with the passage in said input shaft for transmitting pressurized fluid from said inlet port to said external port, a cup member having a port closing edge positioned around said motion input shaft in such a manner as to obstruct fluid flow through said external port and thereby determine the open area of said external port, a cam follower fixed to said motion transmitting structure, and a feedback ramp having a cam surface thereon, said cam follower and said cam surface being mated to impart a rotary motion to said motion input shaft upon movement of said motion input shaft along its longitudinal axis.

4. A fluid pressure amplifier as set forth in claim 3 wherein the angle of said feedback ramp is adjustable relative to the longitudinal axis of said motion input shaft.

5. A fluid pressure amplifier having an enclosed cylinder with a fluid pressure inlet port, a piston disposed in said cylinder for operation by fluid pressure at said inlet port and biased against movement thereby, an output motion transmitting shaft and a hollow motion input shaft extending through opposite end walls of said cylinder and operably connected to said piston to form a motion transmitting structure therewith, said hollow motion input shaft having an external port outside said cylinder and said motion transmitting structure having an internal port inside said cylinder, said internal and external ports communicating with the passage in said input shaft for transmitting pressurized fluid from said inlet port to said external port, a cup member having a port closing edge positioned around said motion input shaft in such a manner as to obstruct fluid flow through said external port and thereby determine the open area of said external port, means to move said closing edge of said cup member relative to said external port in response to a control signal, a cam follower fixed to said motion transmitting structure, and a feedback ramp having a cam surface thereon, said cam follower and said cam surface being mated to impart a rotary motion to said motion input shaft upon movement of said motion input shaft along its longitudinal axis.

6. A fluid pressure amplifier as set forth in claim 5 wherein the angle of said feedback ramp is adjustable relative to the longitudinal axis of said motion input shaft.

7. A fluid pressure amplifier having an enclosed cylinder with a fluid pressure inlet port, a piston disposed in said cylinder for operation by fluid pressure at said inlet port and biased against movement thereby, an output motion transmitting shaft and a hollow motion input shaft extending through opposite end walls of said cylinder and operably connected to said piston, said hollow motion input shaft having an external port outside said cylinder and an internal port inside said cylinder for transmitting pressurized fluid from said inlet port to said external port, a cup member having a port closing edge positioned around said motion input shaft in such a manner as to obstruct fluid flow through said external port and thereby determine the open area of said external port, said port closing edge being at an angle with respect to the longitudinal axis of said motion input shaft, means to move said cup member in either direction along the longitudinal axis of said motion input shaft in response to a control signal, a cam follower fixed to said motion input shaft, and a feedback ramp having a cam surface thereon, said cam follower and said cam surface being mated to impart a rotary motion to said motion input shaft upon movement of said motion input shaft along its longitudinal axis.

8. A fluid pressure amplifier as set forth in claim 7 wherein the angle of said feedback ramp is adjustable relative to the longitudinal axis of said motion input shaft.

9. A fluid pressure amplifier having an enclosed cylinder with a fluid pressure inlet port, a piston disposed in said cylinder for operation by fluid pressure at said inlet port and biased against movement thereby, an output motion transmitting shaft and a hollow motion input shaft extending through opposite end walls of said cylinder and operably connected to said piston to form a motion transmitting structure therewith, said hollow motion input shaft having an external port outside said cylinder and said motion transmitting structure having an internal port inside said cylinder, said internal and external ports communicating with the passage in said input shaft for transmitting pressurized fluid from said inlet port to said external port, a cup member having a port closing edge positioned around said motion input shaft in such a manner as to obstruct fluid flow through said external port and thereby determine the open area of said external port, said port closing edge being parallel to the longitudinal axis of said motion input shaft and said cup member being fixed against movement in a direction along the longitudinal axis of said motion input shaft, means to rotate said cup member in response to an input signal and thereby move said port closing edge over said external port, a cam follower fixed to said motion input shaft, and a feedback ramp having a cam surface thereon, said cam follower and said cam surface being mated to impart a rotary motion to said motion input shaft upon movement of said motion input shaft along its longitudinal axis.

10. A fluid pressure amplifier as set forth in claim 9 wherein the angle of said feedback ramp is adjustable relative to the longitudinal axis of said motion input shaft.

11. A fluid pressure amplifier having an enclosed cylinder with a fluid pressure inlet port, a piston disposed in said cylinder for operation by fluid pressure at said inlet port and biased against movement thereby, an output motion transmitting shaft and a hollow motion input shaft extending through opposite end walls of said cylinder and operably connected to said piston to form a motion transmitting structure therewith, said hollow motion input shaft having an external port outside said cylinder and said motion transmitting structure having an internal port inside said cylinder, said internal and external ports communicating with the passage in said input shaft for transmitting pressurized fluid from said inlet port to said external port, a cup member having a port closing edge positioned around said motion input shaft in such a manner as to obstruct fluid flow through said external port and thereby determine the open area of said external port, said port closing edge being parallel to the longitudinal axis of said motion input shaft and said cup member being fixed against movement in a direction along the longitudinal axis of said motion input shaft, a cup rotating cam follower surface on said cup member, an actuator adapted to be moved in response to a control signal having a cam member thereon which mates with said cam follower on said cup member for rotating said cup member, a cam follower fixed to said motion input shaft, and a feedback ramp having a cam surface thereon, said cam follower and said cam surface being mated to impart a rotary motion to said motion input shaft upon movement of said motion input shaft along its longitudinal axis.

12. A fluid pressure amplifier as set forth in claim 11 wherein the angle of said feedback ramp is adjustable relative to the longitudinal axis of said motion input shaft.

References Cited in the file of this patent

UNITED STATES PATENTS

| | | |
|---|---|---|
| 1,834,773 | Fellmann et al. | Dec. 1, 1931 |